United States Patent [19]
Schkrohowsky et al.

[11] Patent Number: 5,493,474
[45] Date of Patent: Feb. 20, 1996

[54] ENCLOSURE WITH REDUNDANT AIR MOVING SYSTEM

[75] Inventors: Guenter Schkrohowsky, Boise; James L. Dowdy, Eagle; Darrel W. Poulter, Middleton, all of Id.

[73] Assignee: Hewlett-Packard Company, Palo Alto, Calif.

[21] Appl. No.: 388,732

[22] Filed: Feb. 14, 1995

[51] Int. Cl.[6] ..................................... H05R 7/20
[52] U.S. Cl. ........................................ 361/695; 361/725
[58] Field of Search ................................. 361/687–697, 361/724–727; 454/184

[56] References Cited

U.S. PATENT DOCUMENTS

| | | | |
|---|---|---|---|
| 3,387,648 | 6/1968 | Ward, Jr. et al. | 361/692 |
| 4,642,715 | 2/1987 | Ende | 361/687 |
| 4,774,631 | 9/1988 | Okuyama et al. | 361/688 |
| 4,858,070 | 8/1989 | Buran et al. | 361/725 |
| 5,414,591 | 5/1995 | Kimura et al. | 361/687 |

*Primary Examiner*—Gregory D. Thompson
*Attorney, Agent, or Firm*—E. F. Oberheim

[57] ABSTRACT

For cooling a plurality of device modules mounted in an enclosure, a redundant air moving system is coupled to the air duct system of the enclosure. The redundant air moving system has two, three, or more air movers. If one air mover fails, the remaining air mover(s) still provide the required air volume rate for adequate cooling. To make the air movers redundant, they are coupled in parallel to a common air plenum in the air duct system from which ducting to all devices to be cooled is provided. In case of an air mover failure, a flapper door is built into the exhaust path of the air mover. The flapper door is pendulously pivoted in the exhaust path. It is held open by exhaust air flow and is closed by gravity upon cessation of exhaust air flow and held closed by reverse air pressure for the purpose of preventing reverse air flow in the exhaust path, which would disrupt the air pressure in the air plenum and consequently also in the air duct system. The air mover modules are of exterior configuration and approximate dimension corresponding to the device modules, providing ease of insertion and removal with respect to the enclosure, without tools. An air mover can be replaced while the cooling system and the system comprising the devices to be cooled continue to function.

5 Claims, 6 Drawing Sheets

ENCLOSURE WITH REDUNDANT AIR MOVING SYSTEM

CROSS REFERENCE TO RELATED APPLICATIONS

Application of Guenter Schkrohowsky et al, Ser. No. 08/388,783, entitled "Enclosure With Metered Air Passages For Mounting And Cooling Modules," filed on the same day as this application and assigned to the assignee of this invention.

FIELD OF THE INVENTION

This invention relates to enclosures for mounting and cooling various devices, and in particular to enclosures for cooling electronic devices in which redundant air movers, coupled in parallel in an air duct system, are employed to maintain cooling air flow in the event of failure of one of the air movers.

BACKGROUND OF THE INVENTION

In applications where pluralities of devices are packaged in an enclosure and require cooling by air movement through the enclosure, the practice of using a single air mover for providing air flow in the enclosure, necessitates system shutdown in the event of failure of the air mover, which is undesirable. In many instances, removing the air mover for replacement or repair is laborious.

In most instances, shutdown of the system is unacceptable. System shutdown and exchange of a failed air mover frequently require trained personnel with special tools.

An air cooling enclosure for modules is needed in which the failure of an air mover among two or more air movers does not necessitate system shutdown and in which the failed air mover is easily and quickly replaced while the remaining air mover(s) keep the cooling system up and running.

SUMMARY OF THE INVENTION

For cooling a plurality of device modules mounted in an enclosure, a redundant air moving system is coupled to the air duct system of the enclosure. The redundant air moving system has two, three, or more air movers. If one air mover fails, the remaining air mover(s) still provide the required air volume rate for adequate cooling. To make the air movers redundant, they are coupled in parallel to a common air plenum in the air duct system from which ducting to all devices to be cooled is provided. In case of an air mover failure, a flapper door is built into the exhaust path of the air mover. The flapper door is pendulously pivoted in the exhaust path. It is held open by exhaust air flow and is closed by gravity upon cessation of exhaust air flow and held closed by reverse air pressure for the purpose of preventing reverse air flow in the exhaust path, which would disrupt the air pressure in the air plenum and consequently also in the air duct system. The air mover modules are of exterior configuration and approximate dimension corresponding to the device modules, providing ease of insertion and removal with respect to the enclosure, without tools. An air mover can be replaced while the cooling system and the system comprising the devices to be cooled continue to function.

BRIEF DESCRIPTION OF THE DRAWINGS

The invention will be understood by reference to the following specification when considered in conjunction with the accompanying drawings, in which.

DESCRIPTION OF THE PREFERRED EMBODIMENTS

The presently known best mode for practicing this invention is disclosed herein, in the form of a two-bay enclosure for cooling modules 1A–4A, 1B–4B, which are mounted in respective bays A and B which are positioned in a side-by-side relationship in the enclosure 1. The four modules 1A, 2A, 3A and 4A are disposed in a stack in bay A and the four modules 1B, 2B, 3B and 4B are disposed in a stack in bay B. Each module has a slotted entrance air opening or passage 3 in its front end through which air is admitted to the internal air duct system.

Figure 1:
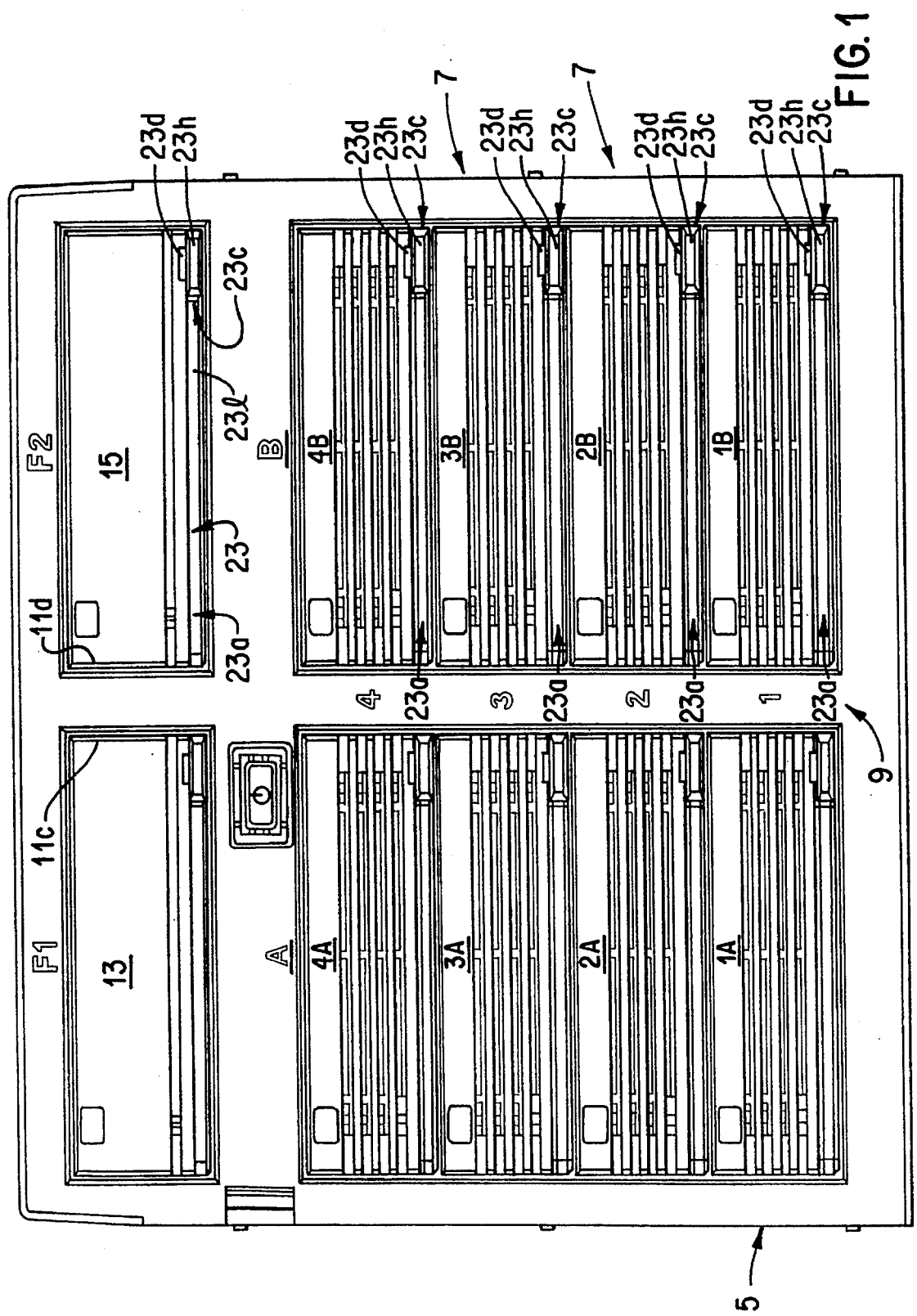
FIG. 1, is a front elevational view of an enclosure assembly for mounting and cooling device modules, which employs redundant air movers and, which depicts the presently known best mode for practicing this invention.
Figure 2:
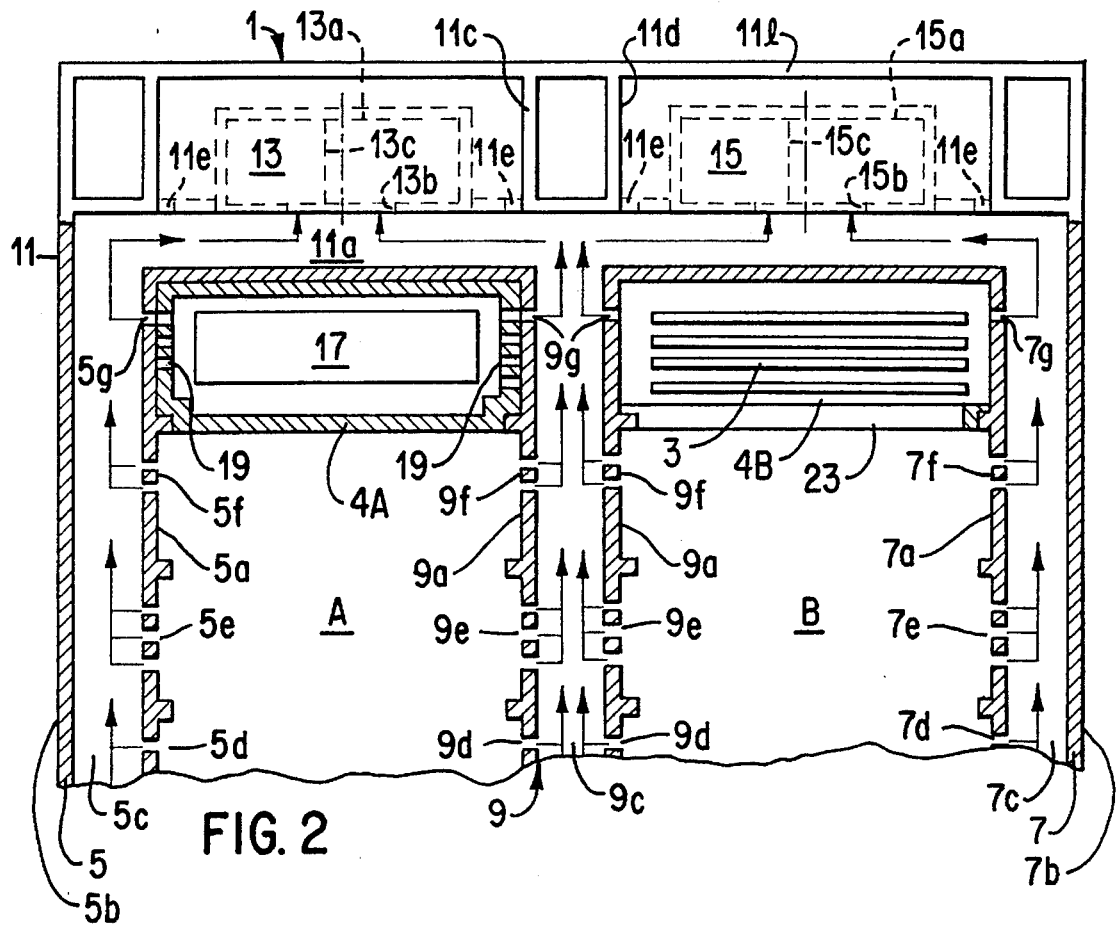
FIG. 2, is a front elevational view, partly in section, schematically illustrating an enclosure assembly for cooling device modules which employs redundant air movers.
Figure 3:
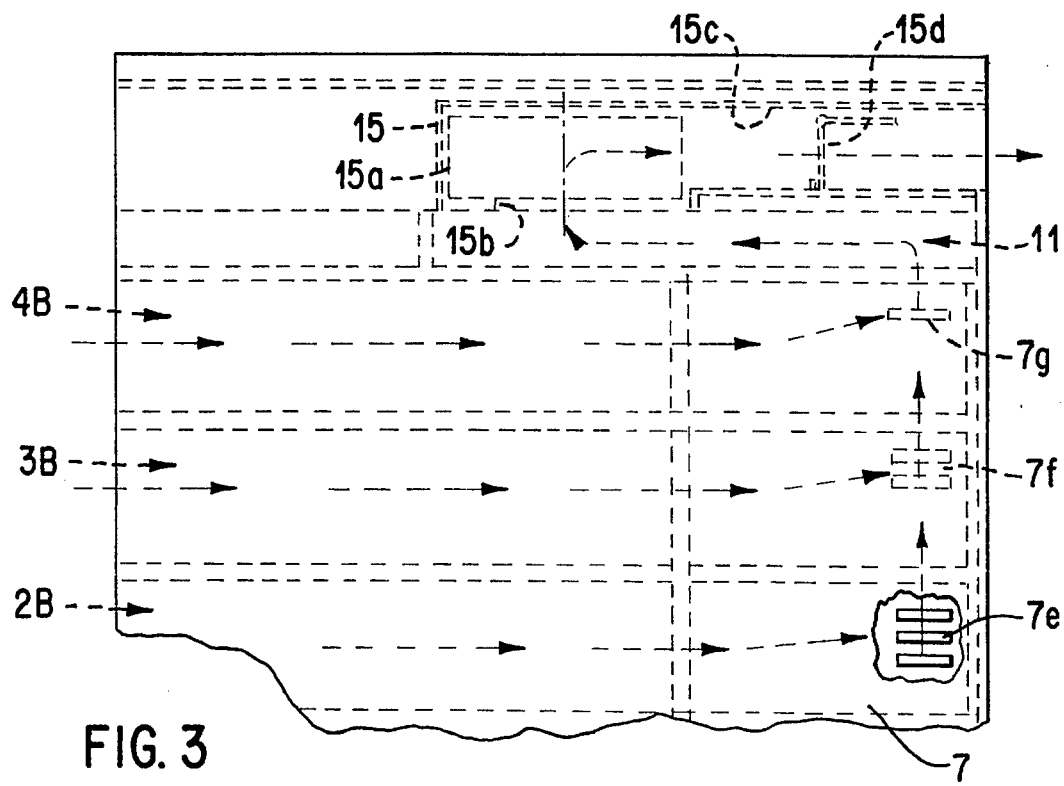
FIG. 3, is a side elevational view of the enclosure assembly of FIG. 1.
Figure 4:
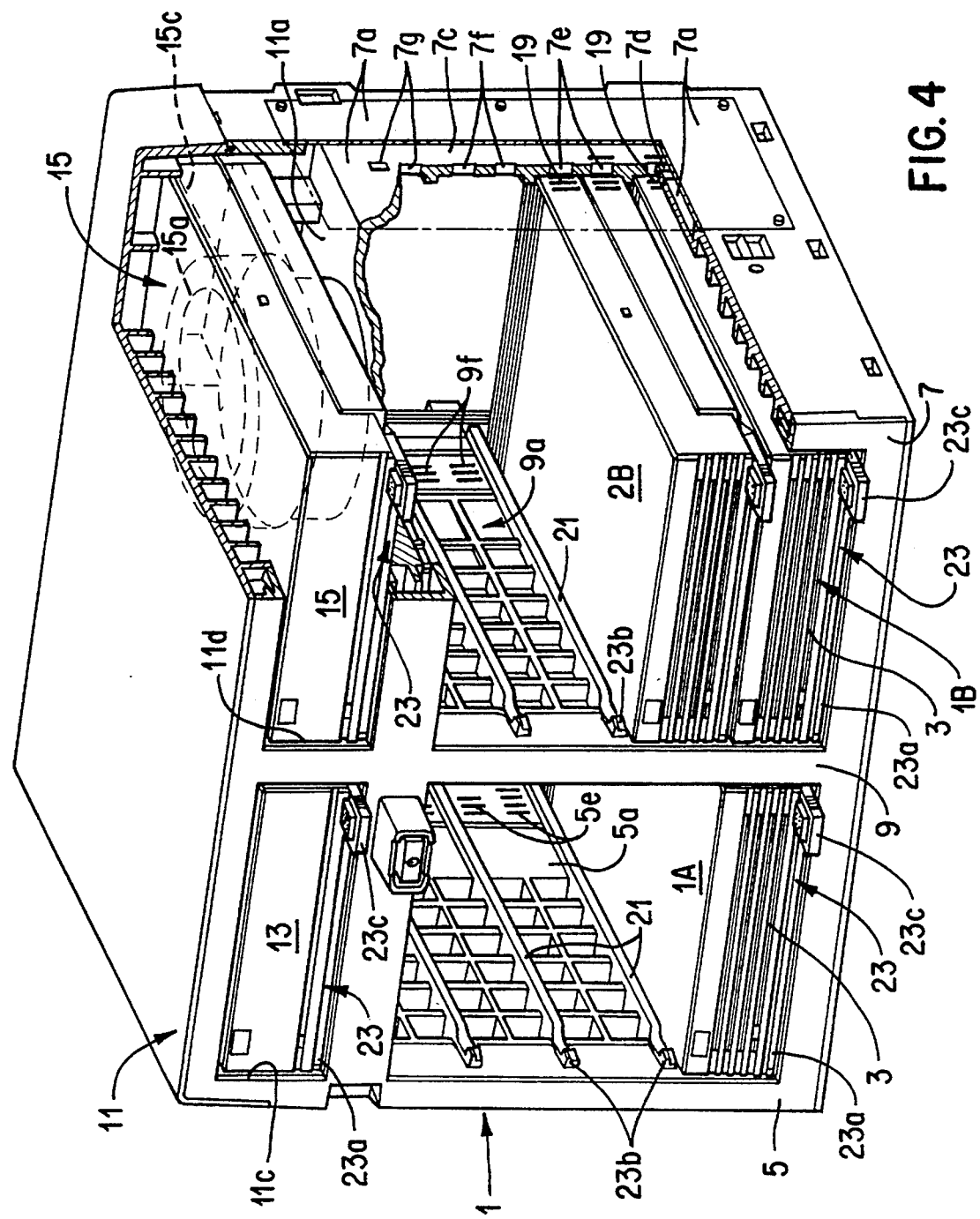
FIG. 4, is an isometric view, fragmentarily in section, of an enclosure for cooling modules, representing the presently known best mode for practicing this invention.

The individual modules 1A–4A, 1B–4B are part of an air duct system, as best seen in FIGS. 2, 3 and 4, which includes air ducts $5c$, $7c$ and $9c$ in the side walls 5 and 7 and in a central wall 9 of the enclosure 1. The air ducts $5c$, $7c$ and $9c$ open into an overhead air plenum $11a$, in an overhead structure 11 of the enclosure 1, which spans the side walls 5 and 7. Individual air movers 13 and 15, which are located in the enclosure 1 above the air plenum $11a$, communicate with the air plenum $11a$. The air movers 13, 15 pull air from the air plenum and exhaust it through the back of the enclosure 1.

When air pressure is reduced in the air plenum $11a$ in the overhead structure 11, air is drawn into the enclosure 1 through the slotted openings in the front ends of the device modules, 1A–4A, 1B–4B, which constitute the entrance air passages 3, travels the length of the device modules, FIG. 3, exits the device modules via exhaust air passages 19 in the respective device modules, enters the air duct $5c$, $7c$ and $9c$ via the metered air passages $5d$–$5g$, $7d$–$7g$ and $9d$–$9g$, respectively, passes through the air ducts $5c$, $7c$ and $9c$ in the side walls 5 and 7 and common wall 9 into the air plenum $11a$, in the overhead structure 11, and is exhausted to the atmosphere via the air movers 13 and 15.

While an enclosure having two bays A and B is shown, the invention may be practiced employing one or more bays.

As seen in FIG. 2, the enclosure 1 comprises the pair of laterally spaced side walls 5 and 7, having inner wall surfaces 5a and 7a and an open end 11a spanning the side walls 5 and 7. Laterally spaced wall sections 5a and 5b, 7a and 7b, of the side walls 5 and 7 define therebetween air ducts 5c, and 7c, respectively. The spaced wall sections 9a of the common wall 9 define an air duct 9c therebetween. The air ducts 5c, 7c and 9c, at their upper ends, open into an air plenum 11a that spans the enclosure 1. The air plenum 11a is defined between the upper surfaces of the bays A and B and an upper enclosure structure 11b which spans the side walls 5 and 7 and provides slots 11c and 11d which mount the air mover modules 13 and 15. The air mover modules 13 and 15 are modules which, conveniently, are of the same width as the device modules, 1A–4A, 1B–4B, and slide on tracks 11e in the bases of the slots 11c, 11d, or other support. Each air mover 13, 15 comprises a centrifugal fan 13a, 15a which communicates with the air plenum 11a via an opening 13b, 15b. The centrifugal fans 13a, 15a, draw air from the air plenum and exhaust the air through an exhaust air duct 13c, 15c, (only the duct 15c is visible in FIG. 3) which opens through the back of the enclosure 1. An air pressure opened, gravity biased closed, flapper valve, 15d, in the exhaust air duct obviates reverse air flow into the air duct system in the event of failure of an air mover module 15. With a corresponding structure, reverse air flow into the air duct system is prevented in the event of failure of air mover module 13.

The air mover modules 13, 15 are identical.

Figure 5:
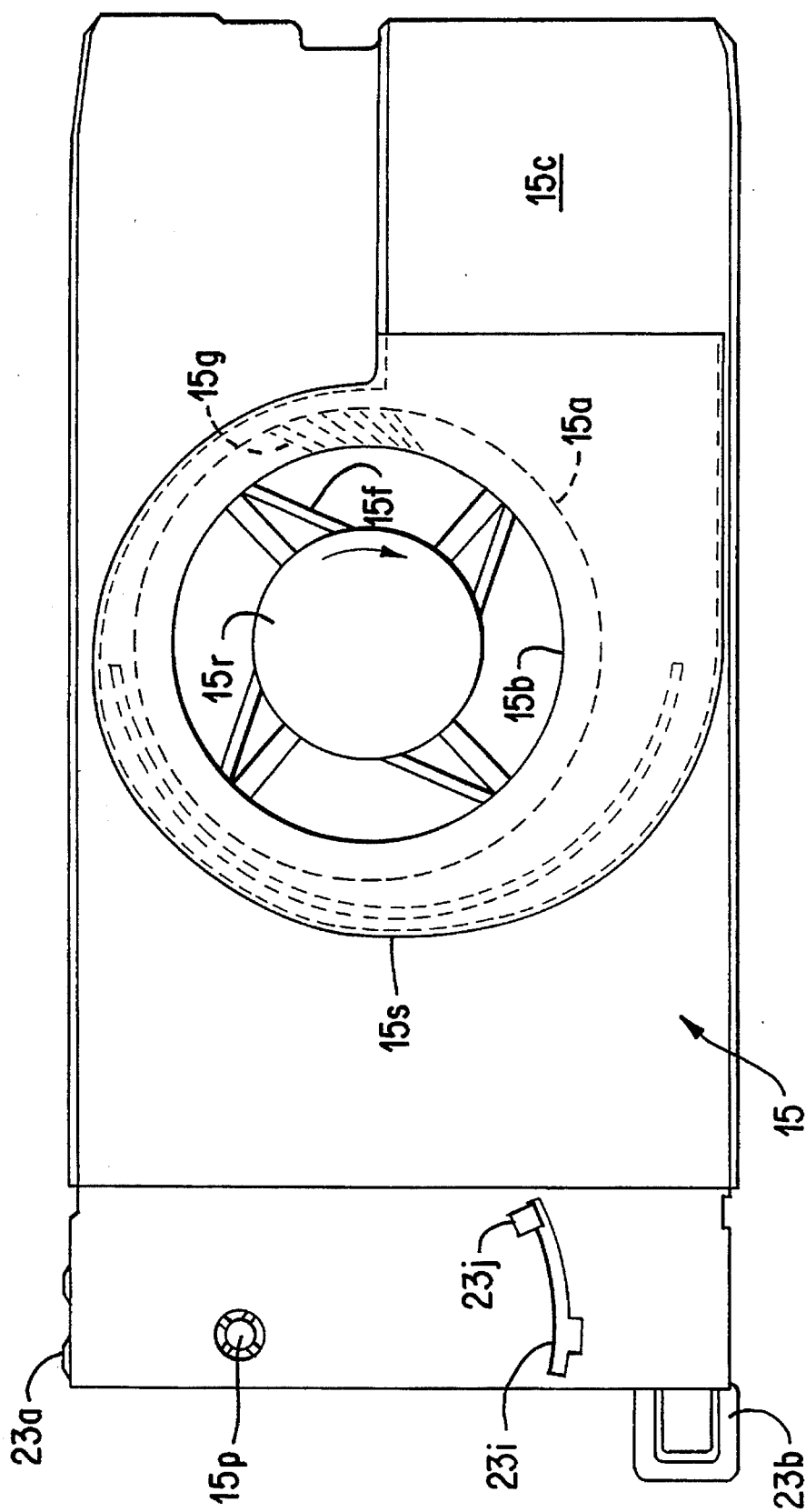
FIG. 5, is a plan view, with the cover removed, of an air mover module embodying the principles of this invention.
Figure 6:
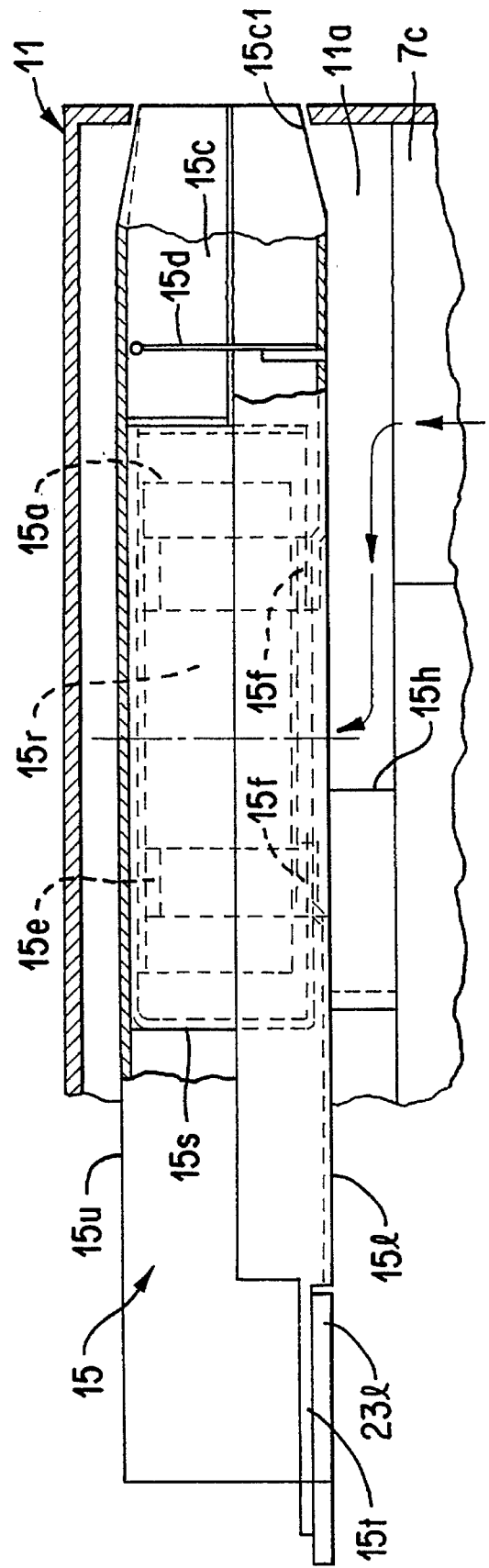
FIG. 6 is a side elevational view, fragmentarily in section, of the air mover module of FIG. 5.

A description of the air mover module 15, as seen in FIGS. 5 and 6, suffices for both. The air mover module 15 comprises a two-piece housing, a lower housing section 15l and an upper housing section 15u. As seen in FIG. 4, when assembled, these housing sections of the air mover module 15 define a rectangular box which slides into the slot 11d in the upper enclosure 11. The air mover module 15 is closed at its front end and extends from the front to the back of the upper enclosure section 11. The back end of the air mover module 15 terminates in the exhaust duct 15c which opens through the back of the enclosure section 11. The lower housing section 15l of the air mover module mounts the centrifugal fan 15a. This fan comprises a shroud 15s within which the fan rotor 15r is mounted. The rotor 15r is journaled on a spindle supported at 15f at the base of the shroud. Concentric circular openings 15b in the lower housing section 15l and in the shroud base, admit air from the air plenum 11a to the centrifugal fan. Air admitted through the concentric circular openings 15b is centrifuged by the rotor 15r into the shroud and exhausted via the exhaust duct 15c to the atmosphere. The upper housing section 15u of the air mover module 15, seats upon the upper surface of the shroud 15s.

The air mover modules are inserted through the front opening of slot 11c and 11d, in the upper enclosure section 11. When the air mover modules are fully inserted, as seen in FIG. 6, the exhaust end, in this case the exhaust 15c1 of the exhaust duct 15c, slides into an opening at the rear of the enclosure section 11.

Figure 7:
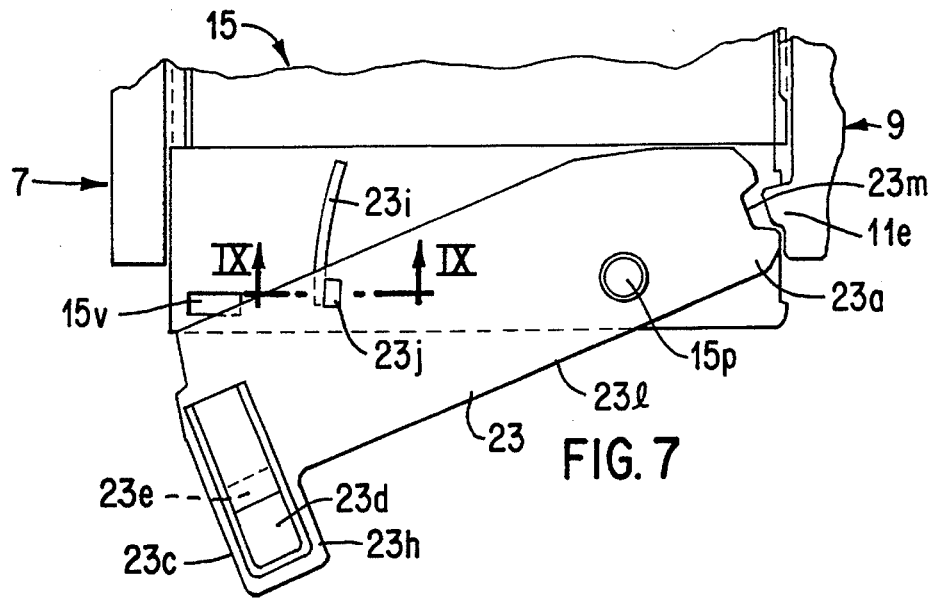
FIGS. 7 and 8, are plan views from the bottom of a latch mechanism for an air mover illustrating the latch in unlatched and latched positions, respectively.
Figure 8:
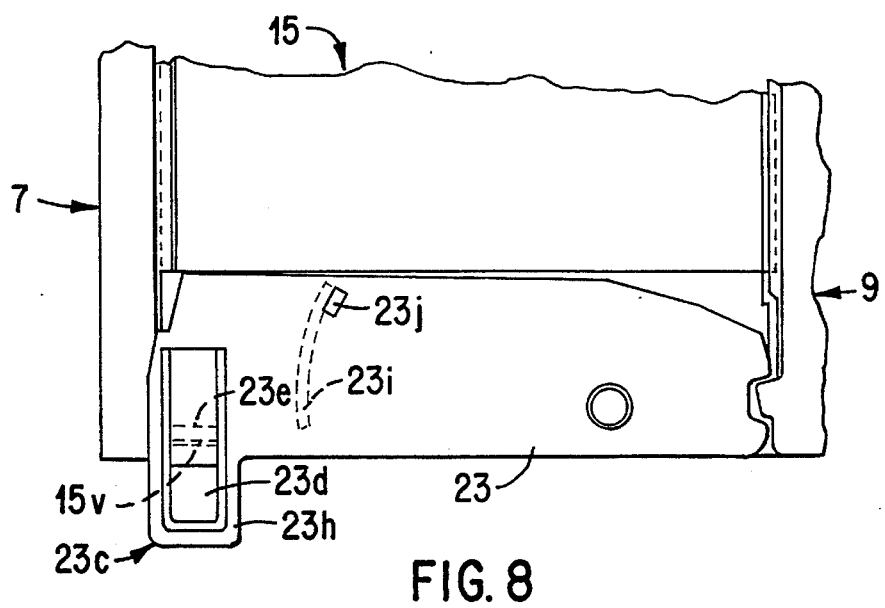
Figure 9:
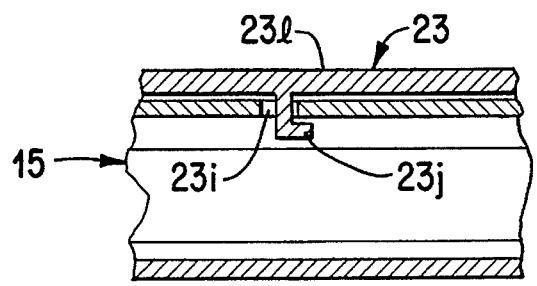
FIG. 9, is a sectional view taken in the section plane IX—IX of FIG. 7.

The air mover is latched in this installed position by a latch mechanism 23 which is pivotally mounted to the bottom side of the lower housing section 15l of the air mover module. As seen in FIGS. 7–9, a recess 15g is provided in the lower surface of the lower housing section 15l. The latch lever 23l is pivotally mounted on a pivot 15p in the recess 15t. The latch lever 23l has a latch end 23a and a handle end 23b. In this position, the outer surface of the latch lever 23 is flush with the bottom surface of the air mover module 15 in which position the latch lever clears the slot 11d.

The latch end of the latch lever 23l is provided with a notch 23m which, in latched position of the latch lever 23, engages a projection 11e on the common wall 9. An arcuate slot 23i in the recess 15t is engaged by an L-shaped member 23j, FIG. 9, on the lever arm 23l and secures the lever 23 to prevent its displacement from the recess 15t during its operation. The L-shaped member restrains the lever to angular movement in a plane within the recess 15t. A handle 23h on the handle end 23c of the latch lever 23l, provides a gripping point for angularly moving the latch lever 23l. A flexible cantilever latch member 23d has a latch 23e which engages a catch notch 15v in the recess 15t. As seen in FIG. 8, when the latch lever 23l is in latched position, the latch member 23e engages the catch notch 15v in the recess 15t.

In preparation for insertion of the air mover module 15 into the slot 11d, the latch lever 23l is moved to unlatched position, as seen in FIG. 7. In this position, the leading edge of the notch 23m at the latch end of the lever 23l, clears the projection 11e in the common wall 9 of the enclosure 1. However, the trailing edge of the notch does not clear the projection, and, as seen in FIG. 7, engages the projection 11e in the common wall 9. With continuing insertion movement of the air mover 15, this engagement of the notch 23m and projection 11e rotates the latch lever 23l in a clockwise direction. The leading edge of the notch 23m now moves below the upper edge of the projection 11e and continuing pressure on the handle 23h, completes the insertion of the air mover module. Moving the latch lever 23l into the latched position, as seen in FIG. 8, completes the insertion of the air mover module. At this point, the latch projection on the latch lever 23l is engaged in the catch notch 15v in the recess 15t, as seen in FIG. 8.

It is evident that the projection 11e may be on the end of the latch lever 23l and that the notch 23m may be in the side wall 9.

What is claimed is:

1. An enclosure assembly for housing and cooling device modules, comprising:

a. a pair of spaced side walls, at least one common wall between said side walls and an open end spanning said side walls, each side wall and said at least one common wall comprising wall structure including spaced wall sections defining an air duct within the wall, the respective air ducts opening through corresponding ends of said side walls and said at least one common wall;

b. an enclosure structure enclosing said corresponding ends of said side walls and said at least one common wall and forming an air plenum therewithin communicating with said air ducts;

c. wall sections of the side walls within said enclosure and both wall sections of said at least one common wall each having metered air openings therethrough providing communication with said air ducts thereat;

d. device modules disposed between and slidably mounted to adjacent surfaces of said side walls and said at least one common wall, each device module having an entrance air passage at one end thereof at said open end of said enclosure and an exhaust air passage on opposite sides of said device module at locations removed from said entrance air passage, each said exhaust air passage being aligned with a metered air passage in an adjacent wall section;

e. at least two air movers coupled in parallel to said air plenum and having exhaust ducts for exhausting air therefrom to the atmosphere, each air mover for reducing the air pressure within said air plenum and inducing air flow into said entrance air passage of each device module, through each said device module, through each said exhaust air passage of each said device module and aligned metered air passage, through each air duct into said air plenum and each air mover to the atmosphere;

f. less than all of said air movers having a combined capacity to provide at least minimum air flow for cooling said device modules, and g. an air pressure opened, pivotally mounted flapper valve in each exhaust duct which closes upon cessation of air flow from a corresponding air mover coupled to that exhaust duct.

2. The enclosure assembly according to claim 1, in which:

a. said pivotally mounted flapper valve is pendulously mounted and is gravity biased to closed position upon cessation of air flow from the corresponding air mover thereat and which in closed position blocks reverse air flow therepast in said exhaust duct.

3. The enclosure assembly according to claim 1, in which:

a. said enclosure structure has individual openings therein adjacent said open end of said enclosure which open into said air plenum, and b. said air movers each comprise an air mover module which is independently insertable into and removable from said air plenum through an opening of said individual openings in said enclosure structure.

4. The enclosure assembly according to claim 3, in which:

a. said air mover module comprises said exhaust duct, and b. insertion of said air mover module into an opening of said individual openings in said enclosure structure, couples said air mover to said air plenum with said exhaust duct.

5. The enclosure assembly according to claim 4, in which:

a. said air mover module comprises a centrifugal fan.

* * * * *